(12) United States Patent
Ju

(10) Patent No.: US 7,275,936 B1
(45) Date of Patent: Oct. 2, 2007

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/524,892

(22) Filed: Sep. 22, 2006

(51) Int. Cl.
*H01R 12/00* (2006.01)

(52) U.S. Cl. .......................................... 439/66; 439/591

(58) Field of Classification Search ................. 439/66, 439/91, 591
See application file for complete search history.

(56) References Cited

U.S. PATENT DOCUMENTS

| | | | |
|---|---|---|---|
| 4,988,305 A | * | 1/1991 | Svenkeson et al. ........... 439/65 |
| 6,132,220 A | * | 10/2000 | McHugh et al. ............... 439/66 |
| 6,488,513 B1 | * | 12/2002 | Neidich et al. ................ 439/66 |
| 6,872,082 B2 | * | 3/2005 | Hsu et al. ...................... 439/66 |

* cited by examiner

*Primary Examiner*—James R. Harvey
(74) *Attorney, Agent, or Firm*—Troxell Law Office PLLC

(57) ABSTRACT

The present invention discloses an electrical connector, comprising an insulating body provided with a plurality of accommodating passages; and an electrical terminal received in the accommodating passage and provided with at least two squeeze arms, which have a counter mechanism, respectively, to prevent swinging. Compared with the conventional art, the electrical connector according to the present invention can maintain the resilience of the electrical terminal and thus ensure a good electrical connection with mating electronic components.

9 Claims, 2 Drawing Sheets

ELECTRICAL CONNECTOR

FIELD OF THE INVENTION

The present invention relates to an electrical connector, and in particular to an electrical connector which is used to connect the land grid array (LGA) chip module to a circuit board.

BACKGROUND OF THE INVENTION

The conventional art of an electrical connector usually connects the LGA chip module to a circuit board, wherein the electrical connector usually comprises electrical terminals. U.S. Pat. No. 6,488,513 discloses an electrical connector which can provide densely spaced contact pads on both ends to compressingly contact with mating electronic components, comprising electrical terminals and an insulating body, wherein the electrical terminal is a C-shape comprising an upper and lower resilient contact arms as well as a body. The upper and lower resilient contact arms extend from the opposite sides of the insulating main body and the lower resilient arm is generally a shape of inclined slot whose end can be pressed against the metal contact of the electronic component (electrical circuit).

However, the drawback of the aforementioned US patent lies in the fact that the poor fatigue resistance of the electrical terminal will negatively affect the electrical connection with its mating electronic components when the resilience of the terminal diminishes after repetitive uses.

Consequently, it is necessary to design a new electrical connector to overcome the aforementioned drawback.

SUMMARY OF THE INVENTION

One object of the present invention is to provide an electrical connector which can ensure a secure electrical connection between two mating electronic components.

To achieve the aforementioned object, the electrical connector according to the present invention comprises an insulating body provided with a plurality of accommodating passage; and an electrical terminal received in the accommodating passage and provided with at least two squeeze arms, which have a counter mechanism, respectively, to prevent swinging.

Compared with the conventional art, the electrical connector according to the present invention can maintain the resilience of the electrical terminal and thus ensure a good electrical connection with mating electronic components.

BRIEF DESCRIPTION OF THE DRAWINGS

The present invention can be more fully understood by reference to the following description and accompanying drawings, in which.

DETAILED DESCRIPTION OF THE INVENTION

Figure 1:
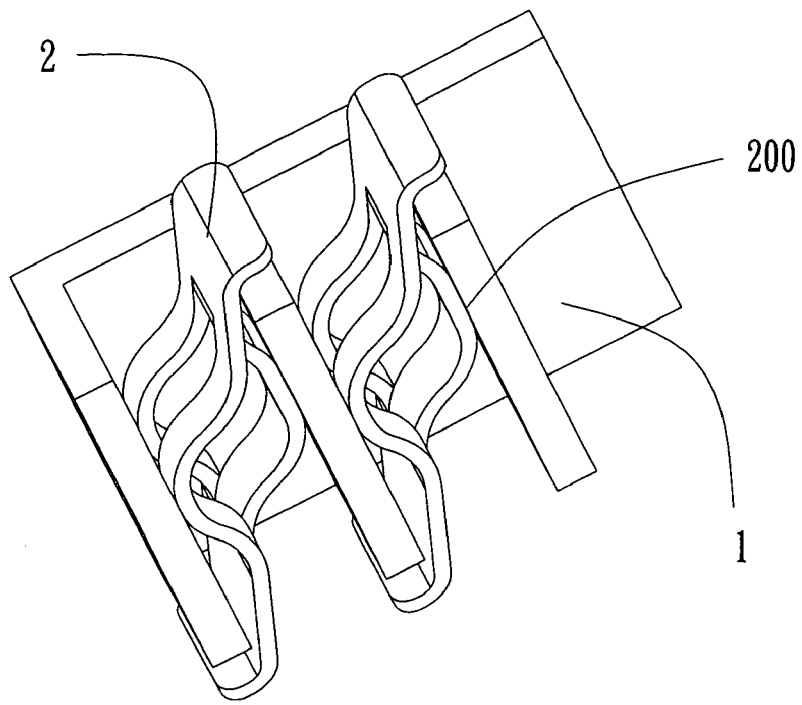
FIG. 1 schematically illustrates a perspective assembly view of a preferred embodiment of the electrical connector according to the present invention.
Figure 2:
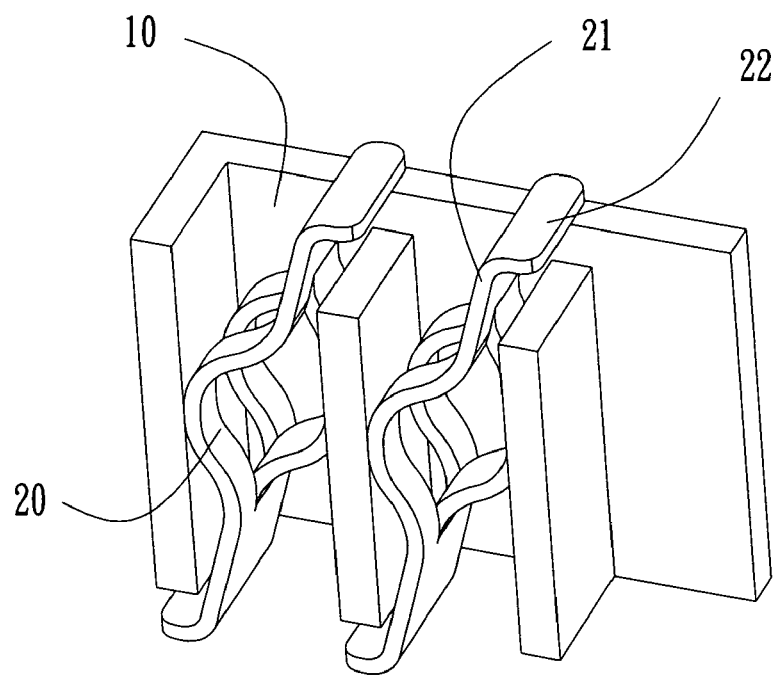
FIG. 2 schematically illustrates a perspective view of the electrical connector in FIG. 1 from another view angle.
Figure 3:
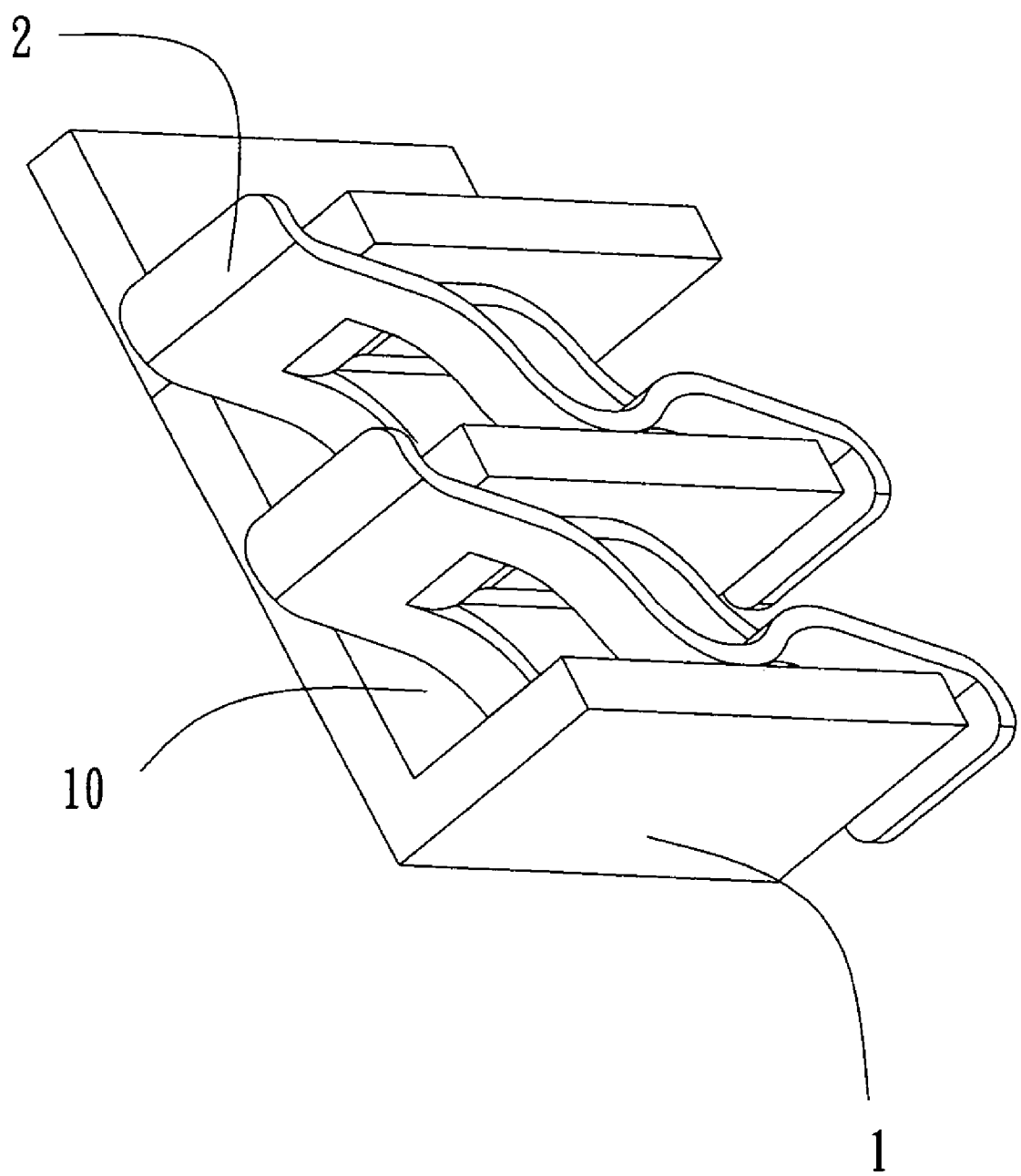
FIG. 3 schematically illustrates a perspective view of the electrical connector in FIG. 1 from yet another view angle.

With reference to FIGS. 1 to 3, the electrical connector according to the present invention is to establish electrical connection between two mating electronic components, for example but not limited to, connecting the Land Grid Array (LGA) chip module to a circuit board (both not shown). Of course, the electrical connector can also establish mating connection for other electronic components, for example but not limited to, two circuit boards and so on. The electrical connector comprises an insulating body 1 and an electrical terminal 2, wherein the insulating body 1 is provided with a plurality of accommodating passages 10 and the electrical terminal 2 is received in the accommodating passage 10 of the insulating body 1.

The electrical terminal 2 having a shape of strip is received in the accommodating passage 10. The electrical terminal 2 comprises at least a squeeze arm 20, but can be disposed, for example but not limited to, at least two squeeze arm 20 which are disposed face to face. The squeeze arm 20 further comprises a contact portion 21 extending from both ends, respectively. The end of each contact portion 21 forms a contact pad 22 which can establish contact with mating electronic components. Also, the two contact portions 21 of the electrical terminal 2 are staggered with respective to each other vertically, wherein the squeeze arm 20 is disposed in the middle of the electrical terminal 2 and formed by, for example but not limited to, stamping.

Furthermore, the number of squeeze arm 20 of the electrical terminal 2 can be three instead of two, wherein the two squeeze arms 20 are parallel disposed and the remaining one is disposed face to face with the two parallel squeeze arms 20. The squeeze arm 20 is further provided with a counter mechanism to prevent swinging. In one preferred embodiment according to the present invention, the squeeze arm 20 is further disposed with at least a plane 200 to lean against the insulating body 1 (of course, the other side of the squeeze arm 20 may also be provided with one other plane 200, or a contact pad (not shown) is provided on the other side of the counter mechanism and the extending vertical line of the contact pad is on the plane 200). In another embodiment of according to the present invention, the counter mechanism may also comprise two contact points on the squeeze arm to achieve the same function. With the aforementioned counter mechanisms, it is possible to provide enough resilience for the squeeze arm 20.

During the assembling process, the mating electronic component is connected with the electrical terminal 2 and the squeeze arm 20 may abut against the insulating body 1 to provide enough resilience such that the contact portion 21 of the electrical terminal 2 may have a better contact with the mating electrical component. When the mating electronic component is disengaged, the contact portion 21 of the electrical terminal 2 may return to original shape due to the resilience of the squeeze arm 20.

Consequently, the electrical connector according to the present invention may provide better resilience for the electrical terminal to ensure a better electrical connection with the mating electronic component, which can overcome the drawbacks of the conventional art.

While the invention has been described with reference to the a preferred embodiment thereof, it is to be understood that modifications or variations may be easily made without departing from the spirit of this invention, which is defined by the appended claims.

What is claimed is:

1. An electrical connector comprising:
   a) an insulating body having a plurality of accommodating spaces; and
   b) a plurality of electrical terminals, one of the plurality of electrical terminals is located in each of the plurality of accommodating spaces, each of the plurality of electrical terminals having:
      I) first and second contact portions located on opposing ends of the electric terminal; and
      ii) at least two squeeze arms located in a middle portion of the electrical terminal adjacent to the first and second contact portions and extending outwardly from the middle portion in opposite directions,
   wherein the at least two squeeze arms engaging two opposing surfaces of a corresponding accommodating space of the plurality of accommodating spaces;
   wherein the at least two squeeze arms are three squeeze arms including two outer arms and one inner arm, the inner arm is located between the two outer arms and extends in a direction opposite the two outer arms.

2. The electrical connector according to claim 1, wherein at least one of the at least two squeeze arms has a flat portion engaging one of the two opposing surfaces of the corresponding accommodating space.

3. The electrical connector according to claim 1, wherein each first contact portion has a first contact pad located on an end opposite the at least two squeeze arms.

4. The electrical connector according to claim 3, wherein each second contact portion has a second contact pad located on an end opposite the at least two squeeze arms.

5. The electrical connector according to claim 4, wherein the first contact pad and the second contact pad extend outwardly in opposite directions.

6. The electrical connector according to claim 1, wherein at least one of the three squeeze arms has a flat portion engaging one of the two opposing surfaces of the corresponding accommodating space.

7. The electrical connector according to claim 1, wherein each first contact portion has a first contact pad located on an end opposite the at least two squeeze arms.

8. The electrical connector according to claim 7, wherein each second contact portion has a second contact pad located on an end opposite the at least two squeeze arms.

9. The electrical connector according to claim 8, wherein the first contact pad and the second contact pad extend outwardly in opposite directions.

* * * * *